(12) United States Patent
Min et al.

(10) Patent No.: US 7,349,278 B2
(45) Date of Patent: Mar. 25, 2008

(54) DRAM AND METHOD FOR PARTIALLY REFRESHING MEMORY CELL ARRAY

(75) Inventors: Young-Sun Min, Seoul (KR); Jong-Hyun Choi, Suwon-si (KR); Nam-Jong Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 51 days.

(21) Appl. No.: 11/485,565

(22) Filed: Jul. 12, 2006

(65) Prior Publication Data

US 2007/0014175 A1    Jan. 18, 2007

(30) Foreign Application Priority Data

Jul. 13, 2005    (KR) .................. 10-2005-0063331

(51) Int. Cl.
*G11C 29/00*    (2006.01)
(52) U.S. Cl. ...................................... 365/222; 365/205
(58) Field of Classification Search ................ 365/222, 365/205, 194
See application file for complete search history.

(56) References Cited

U.S. PATENT DOCUMENTS

| | | | |
|---|---|---|---|
| 6,344,990 B1 | 2/2002 | Matsumiya et al. | 365/63 |
| 6,449,182 B1 | 9/2002 | Ooishi | 365/63 |
| 6,452,855 B1* | 9/2002 | Hsu et al. | 365/230.03 |
| 6,590,822 B2 | 7/2003 | Hwang et al. | 365/222 |
| 6,775,177 B2 | 8/2004 | Okamoto et al. | 365/149 |
| 6,819,617 B2 | 11/2004 | Hwang et al. | 365/222 |
| 6,850,449 B2* | 2/2005 | Takahashi | 365/222 |
| 7,072,204 B2* | 7/2006 | Tsukikawa et al. | 365/149 |
| 2003/0214832 A1 | 11/2003 | Okamoto et al. | 365/149 |
| 2004/0100847 A1 | 5/2004 | Derner et al. | 365/222 |

FOREIGN PATENT DOCUMENTS

| | | |
|---|---|---|
| KR | 10-2003-0089410 | 11/2003 |
| KR | 10-2004-0006767 | 1/2004 |
| KR | 10-443909 | 7/2004 |

* cited by examiner

Primary Examiner—Vu A. Le
(74) Attorney, Agent, or Firm—Mills & Onello LLP

(57) ABSTRACT

A method of a partial array self-refresh (PASR) operation for a dynamic random-access memory (DRAM) device includes initiating a PASR mode; writing data into a first single cell of a twin cell and inverted data of the data into a second single cell of the twin cell, during a first refresh period of the PASR mode; and concurrently refreshing the first and second single cells that are included in the twin cell, during subsequent refresh periods of the PASR mode following the first refresh period. Embodiments according to the invention can extend the period of refresh operations by applying a PASR technique for a twin cell to a single cell and thereby reduce the power consumption of the refresh operations.

10 Claims, 9 Drawing Sheets

DRAM AND METHOD FOR PARTIALLY REFRESHING MEMORY CELL ARRAY

CROSS-REFERENCE TO RELATED APPLICATIONS

This application claims priority under 35 U.S.C. § 119(a) to Korean Patent Application No. 2005-63331 filed on Jul. 13, 2005, the contents of which are herein incorporated by reference in its entirety.

BACKGROUND OF THE INVENTION

1. Field of the invention

The present invention relates to a dynamic random-access memory (DRAM) device, and more particularly to a DRAM device that supports a partial array self-refresh operation and a method for partially refreshing a memory cell array.

2. Description of the Related Art

In portable devices or mobile devices such as mobile phones, technology is required for minimizing power consumption of batteries, so as to extend battery lifetime. As such devices have been provided with features requiring the processing of a large amount of data, such as moving picture data, DRAM chips included in such devices have been continuously increasing in capacity.

A typical DRAM device executes a periodic refresh operation, in order to preserve data stored in each cell of the device during operation. Such periodic refresh operations consume a considerable amount of battery power of a mobile device. In general, the larger the capacity of the DRAM device, the more power is consumed by the refresh operations.

To reduce the power consumed by the refresh operations, some DRAM devices adopt a partial array self-refresh (PASR) technique in which a refresh operation is executed only for that portion or subset of the entire memory that is actually in use.

FIG. 1 is a conceptual diagram illustrating a bank configuration of memory cells according to the PASR technique for a conventional single-cell DRAM. As shown in FIG. 1, according to a ½ PASR technique, a refresh operation for memory banks A and B is performed, and a refresh operation for memory banks C and D is not performed.

PASR techniques for DRAM devices are disclosed in Korean Patent No. 443909, U.S. Pat. Nos. 6,819,617, 6,590,822, Korean Patent Laid-Open Publication No. 2004-6767, and U.S. Patent Application Publication No. 2004/0100847, the contents of which are incorporated herein by reference.

Meanwhile, twin-cell memory devices have recently been introduced. By assigning two memory cells for access to a single bit of data, the twin-cell memory device requires twice as large an area as the single-cell memory device for storing the same amount of information, but provides for faster data access than the single-cell memory device due to a larger voltage variation amplitude applied to the bit lines, the amplitude being twice as large as that of the single-cell memory device.

FIG. 2 is a conceptual diagram illustrating a bank configuration of memory cells according to the PASR technique for a conventional twin-cell DRAM. When executing the PASR, the twin-cell memory device in FIG. 2 selects a pair of word lines WL0 and WL1 to refresh one bit of data.

A semiconductor memory device that can be transformed between two configuration modes; namely, a single memory cell configuration and a twin memory cell configuration, is disclosed in Korean Patent Laid-Open Publication No. 2003-89410 and U.S. Pat. No. 6,775,177, the contents of which are incorporated herein by reference.

SUMMARY OF THE INVENTION

Example embodiments of the present invention provide a dynamic random-access memory (DRAM) that extends the period of refresh operations by applying a partial array self-refresh (PASR) technique for a twin-cell DRAM to a single-cell DRAM.

Other example embodiments of the present invention provide a PASR method for a single-cell DRAM.

In one aspect, the present invention is directed to a dynamic random access memory (DRAM) device that includes a memory cell array including a plurality of memory cells, the memory cells being respectively allocated in sections defined by a plurality of word lines a plurality of bit line pairs; and a decoder configured to select a single cell of the word line and the bit line to write one bit of data in the single cell, the single cell being designated by an external address signal, sequentially select each word line of a word line pair corresponding to a twin cell including the single cell so that inverted data of the data written in the single cell is to be written in the other single cell of the twin cell, during a first refresh period of a partial array self-refresh (PASR) mode, and concurrently select the word lines of the word line pair corresponding to the twin cell to execute twin-cell self-refresh operations, during subsequent refresh periods of the PASR mode following the first refresh period.

In one embodiment, during the first refresh period, the decoder may first activate the word line corresponding to the single cell of the twin cell, then activate the other word line corresponding to the other single cell of the twin cell, and then concurrently deactivate the activated word lines corresponding to the single cell and the other single cell. A bit line pair sense amplifier detects the data of the single cell applied to the bit line and amplifies the potential of the inverted bit line. Then, inverted data is written in the other single cell by activation of the word line of the other single cell connected to the inverted bit line.

In another embodiment, the first refresh period is a period of a single-cell refresh mode, and the following refresh period is a period of a twin-cell refresh mode. The period of the single-cell refresh mode is typically based on a period for refreshing a memory cell containing data '1'. However, the period of the twin-cell refresh mode may be based on a period for refreshing a memory cell containing data '0', and an interval between the refresh operations may be considerably extended to, for example, 10 times longer than that of the single-cell refresh mode. Overall refresh currents consumed during the PASR operations and eventually power consumption of mobile devices can therefore be reduced.

In another embodiment, the DRAM device can further include a twin-cell refresh control circuit that compares a present internal refresh address signal with a termination internal address signal corresponding to an address at termination of the PASR mode to generate a twin-cell refresh control signal based on the comparison result, and provides the twin-cell refresh control signal to the decoder.

In another embodiment, the twin-cell refresh control circuit can include a twin-cell mode determining circuit that compares the present internal refresh address signal with the termination internal address signal corresponding to the address at termination of the PASR mode, and a control signal generator that generates the twin-cell refresh control signal based on the comparison result.

In another aspect, the present invention is directed to a method of a partial array self-refresh (PASR) operation for a dynamic random access memory device includes initiating a PASR mode; writing data into a first single cell of a twin cell and inverted data of the data into a second single cell of the twin cell, during a first refresh period of the PASR mode; and concurrently refreshing the first and second single cells that are included in the twin cell, during subsequent refresh periods following the first refresh period.

In one embodiment, the first refresh period may be a period of a single-cell refresh mode, and the subsequent refresh period may be a period of a twin-cell refresh mode. One of the single cells that are included in the twin cell may be used for storing data in the PASR mode.

BRIEF DESCRIPTION OF THE DRAWINGS

The above and other features and advantages of the present invention will become more apparent by describing in detail example embodiments thereof with reference to the accompanying drawings, in which.

DETAILED DESCRIPTION OF EMBODIMENTS OF THE INVENTION

Figure 1:
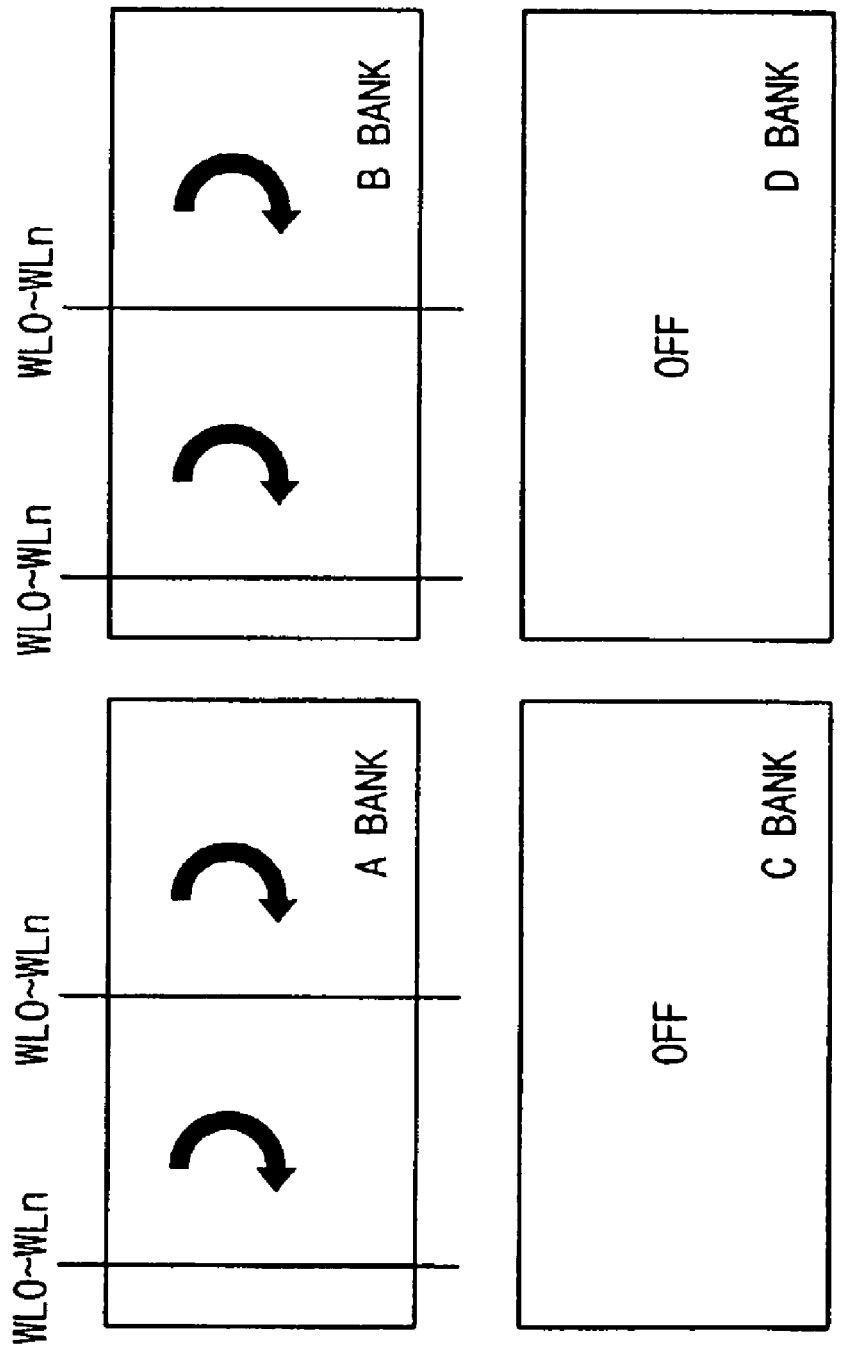
FIG. 1 is a conceptual diagram illustrating a bank configuration of memory cells according to a partial array self-refresh (PASR) technique for a conventional single-cell dynamic random-access memory (DRAM)
Figure 2:
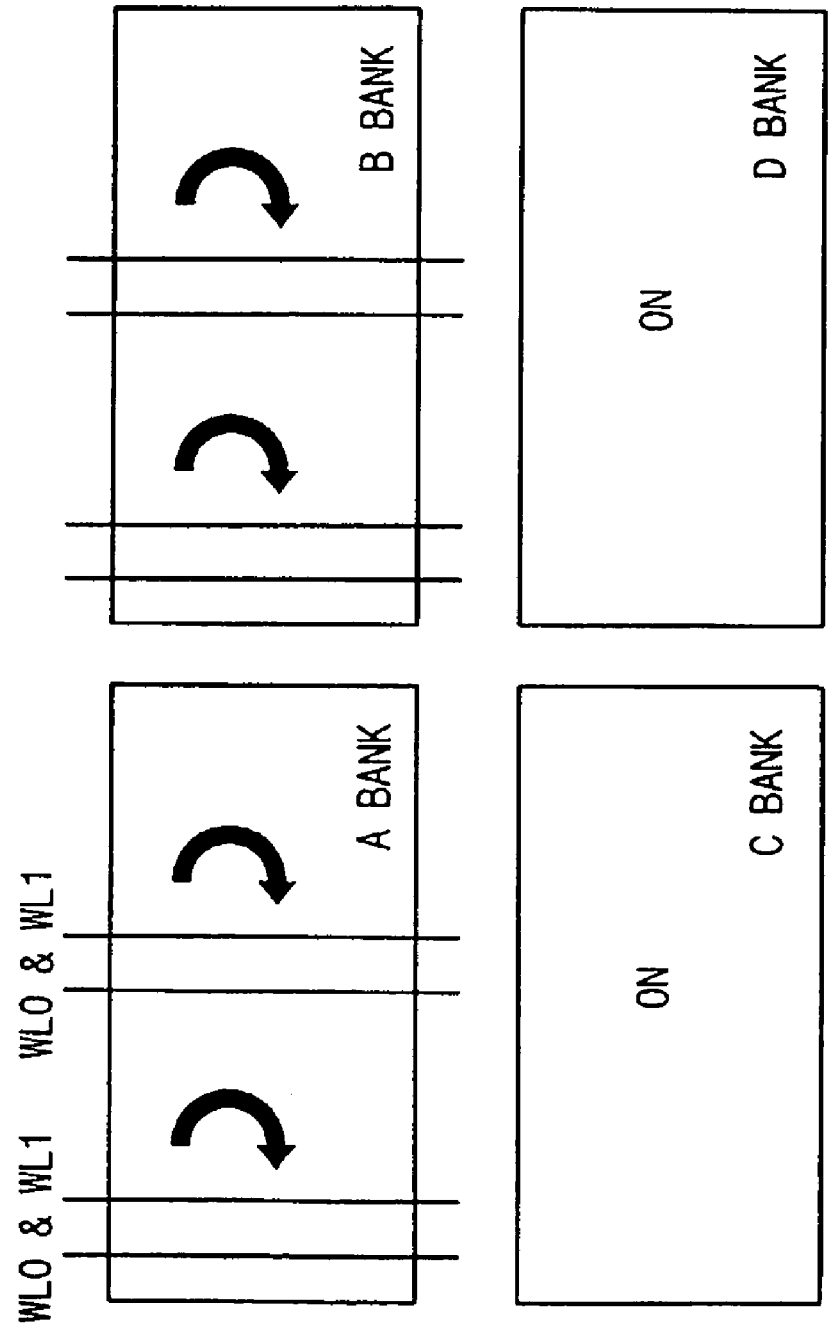
FIG. 2 is a conceptual diagram illustrating a bank configuration of memory cells according to the PASR technique for a conventional twin-cell DRAM.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete. In the drawings, the size and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
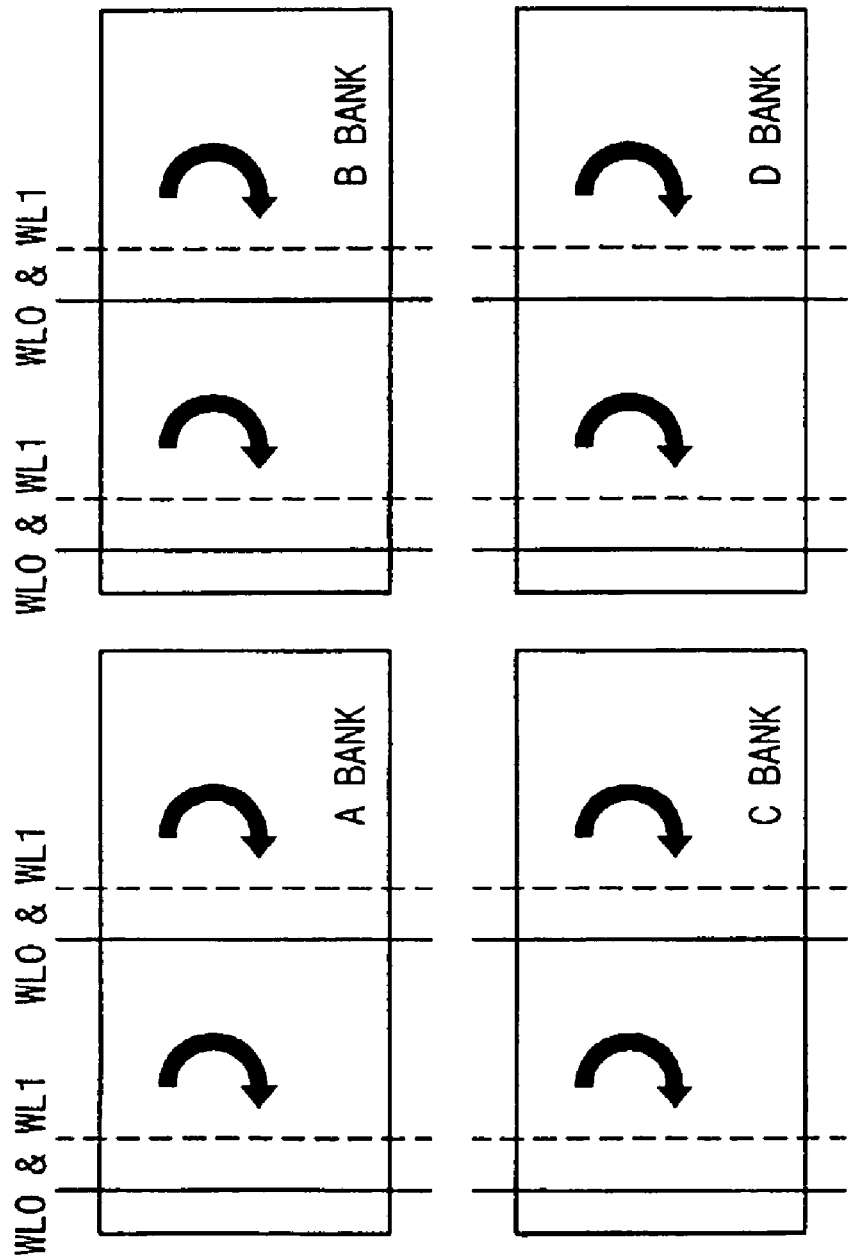
FIG. 3 is a conceptual diagram illustrating a single-cell DRAM device adopting a twin-cell ½ PASR operation according to example embodiments of the present invention.
Figure 4:
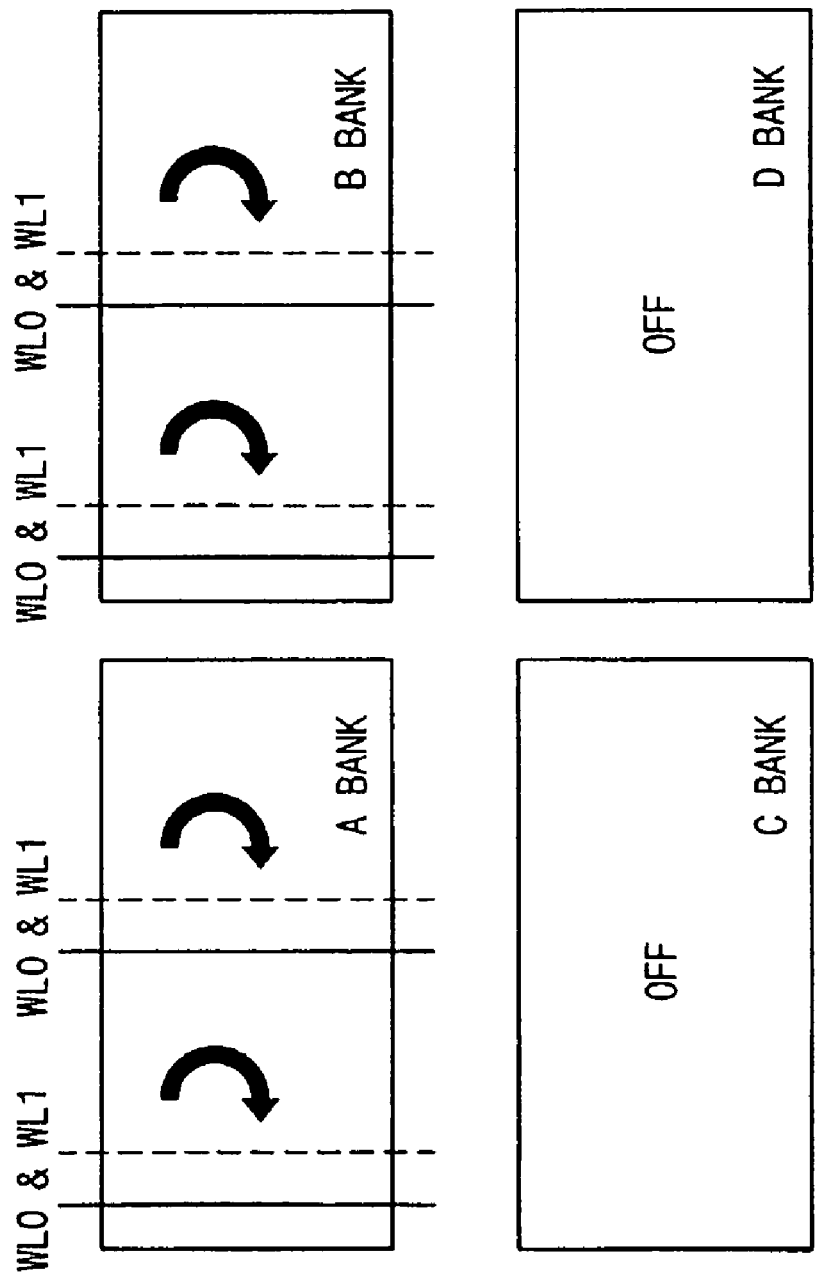
FIG. 4 is a conceptual diagram illustrating a single-cell DRAM device adopting a twin-cell ¼ PASR operation according to example embodiments of the present invention.

FIG. 3 is a conceptual diagram illustrating a single-cell dynamic random-access memory (DRAM) device adopting a twin-cell ½ partial array self-refresh (PASR) operation, according to example embodiments of the present invention. FIG. 4 is a conceptual diagram illustrating a single-cell DRAM device adopting a twin-cell ¼ PASR operation, according to example embodiments of the present invention.

Referring to FIG. 3, a DRAM device operating in ½ PASR mode has an effective memory capacity reduced to half of the total capacity, but executes refresh operations on all of the memory cells.

In the first period of the refresh operations, data written at cells connected to word lines WL0 (illustrated by solid lines) are inverted, and then the inverted data are stored into cells connected to word lines WL1 (illustrated by dashed lines). In subsequent periods of the refresh operations, that is period following the first refresh period, the word lines WL0 and WL1 are driven at the same time for executing twin-cell refresh operations. The refresh operation invalidates data that was written before the refresh operation in the cells that are driven by the word lines illustrated by dashed lines.

Therefore, effective data should be stored in the cells driven by the word lines illustrated by solid lines from the beginning, or the data in the cells driven by the word lines illustrated by dashed lines should be transferred to the cells driven by the word lines illustrated by solid lines, prior to initiation of the refresh operation.

Referring to FIG. 4, a DRAM device in ¼ PASR mode according to example embodiments of the present invention has an effective capacity reduced to one-quarter of the total device capacity, but executes the refresh operations over half of the memory cells.

Figure 5A:
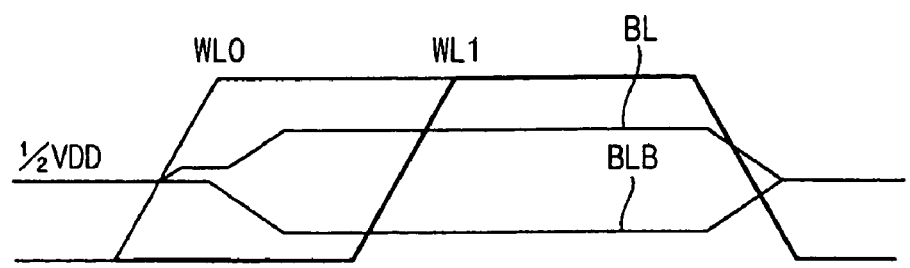
FIG. 5A is a timing diagram for word lines to be driven at the first period of periodic self-refresh operations according to example embodiments of the present invention.
Figure 5B:
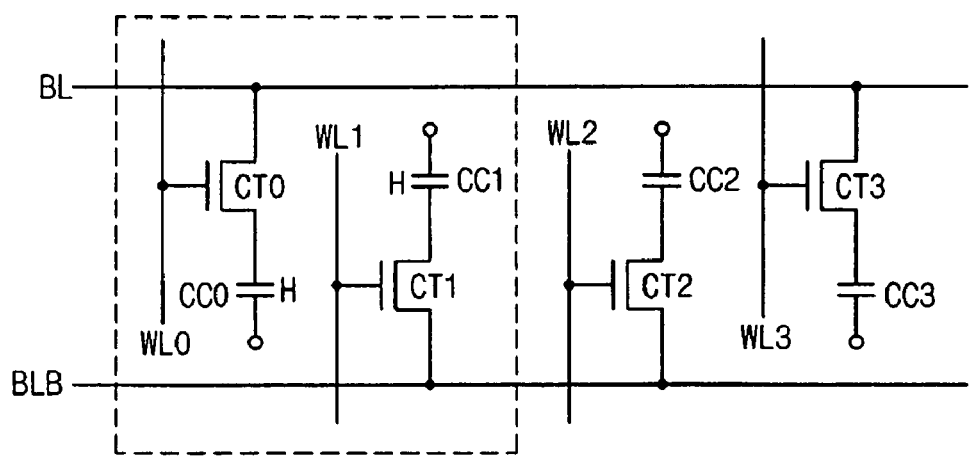
FIGS. 5B and 5C are circuit diagrams respectively illustrating the writing data in a single cell and in a twin cell device, respectively.
Figure 5C:
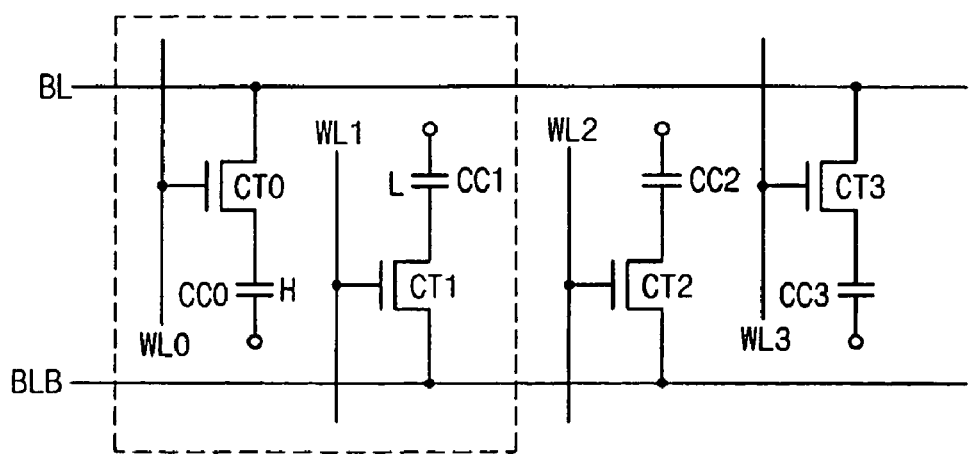

FIG. 5A is a timing diagram for word lines and bit lines at the first period of self-refresh operations. FIGS. 5B and 5C are circuit diagrams respectively illustrating the writing of data when operating in the single-cell mode and in the twin-cell mode.

Referring to FIGS. 5A, 5B and 5C, a 'single cell' consists of a cell transistor CT0 and a cell capacitor CC0. The cell transistor CT0 has a gate connected to a word line WL0, a drain connected to a bit line BL, and a source coupled to a power supply voltage via the cell capacitor CC0. Another single cell consists of a cell transistor CT1 and a cell capacitor CC1. The cell transistor CT1 has a gate connected to a word line WL1, a drain connected to an inverted bit line BBL, and a source coupled to a power supply voltage via the cell capacitor CC1.

At an initial stage, for example, both of the cell capacitors are assumed to contain logic high bits as shown in FIG. 5B. The word line WL0 is gradually raised to a logic 'high' level, and then the cell transistor CT0 is turned on. The charge stored in the cell capacitor CC0 is proportionally distributed to the bit line BL, so that a potential of the bit line BL is increased from ½ VDD (half of a power supply voltage) to a given potential. A sense amplifier (not shown) detects the potential variation and amplifies the potential discrepancy between the bit line BL and the inverted bit line BBL, so that the potential of the bit line BL becomes a logic 'high' level, and the potential of the inverted bit line BBL becomes a logic 'low' level.

While the pair of bit lines BL and BLB are driven by the data H (logic 'high') of the cell capacitor CC0, the cell transistor CT1 is turned on at the transition of word line WL1 from a logic 'low' to a logic 'high' level. Then the cell capacitor CC1 is discharged by the inverted bit line BLB to be transitioned to a logic 'low' level.

After a given time, both of the word lines WL0 and WL1 are deactivated. The cell capacitor CC0 is recharged as a logic 'high' level as the initial stage, and the cell capacitor CC1 remains as a logic 'low' level that is an inverted logic relative to the initial stage, as shown in FIG. 5C.

The above operations are sequentially executed with respect to all of the word lines so as to complete the first period of the refresh operations. Following the first period of the refresh operations, the memory cell array is converted in operation mode from the single-cell mode to the twin-cell mode.

During the refresh periods that follow the first refresh period, the twin-cell mode self-refresh operations, which drive both of the word lines WL0 and WL1, are executed.

Figure 6:
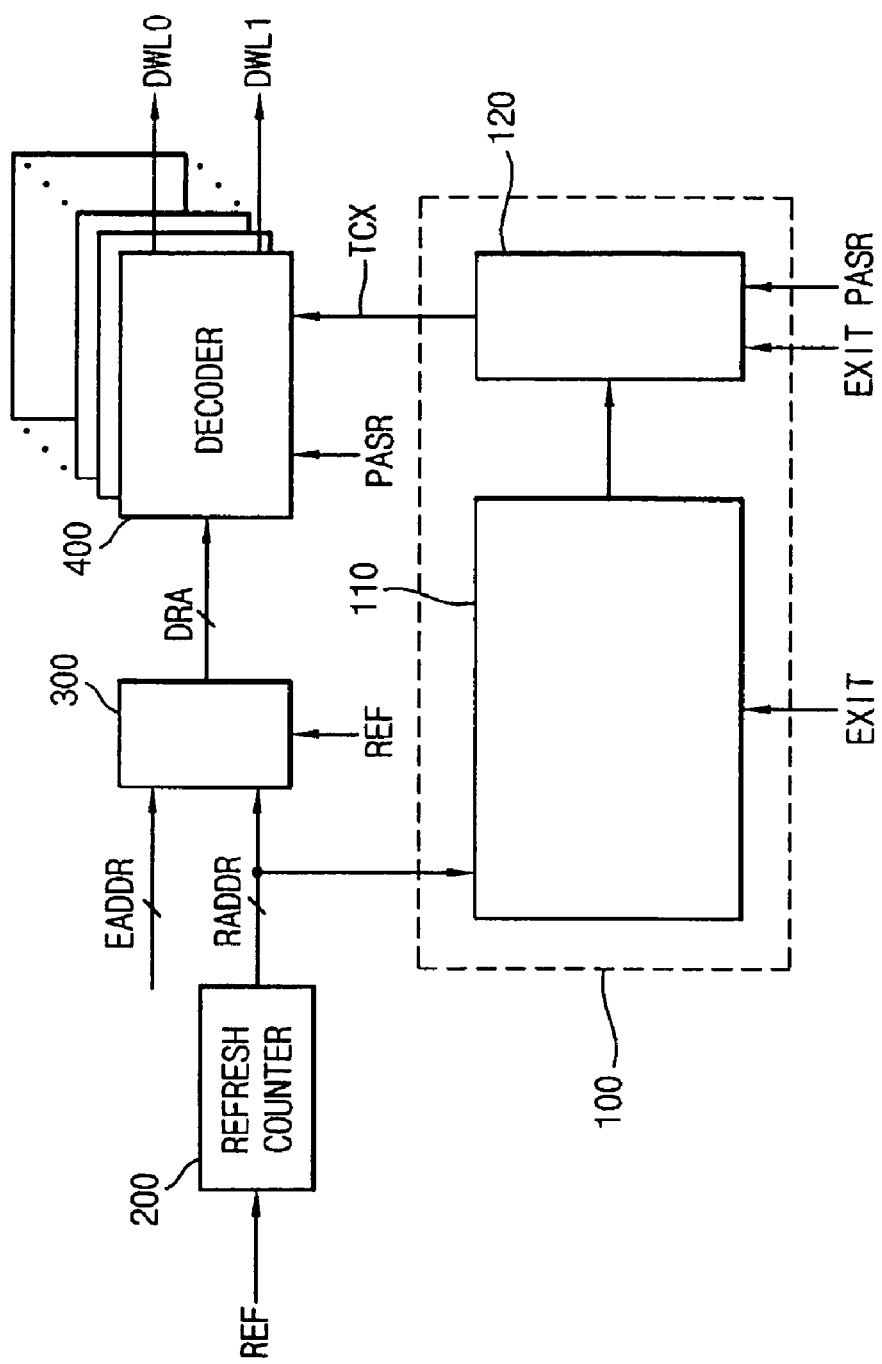
FIG. 6 is a block diagram illustrating a twin-cell PASR control circuit according to example embodiments of the present invention.
Figure 7:
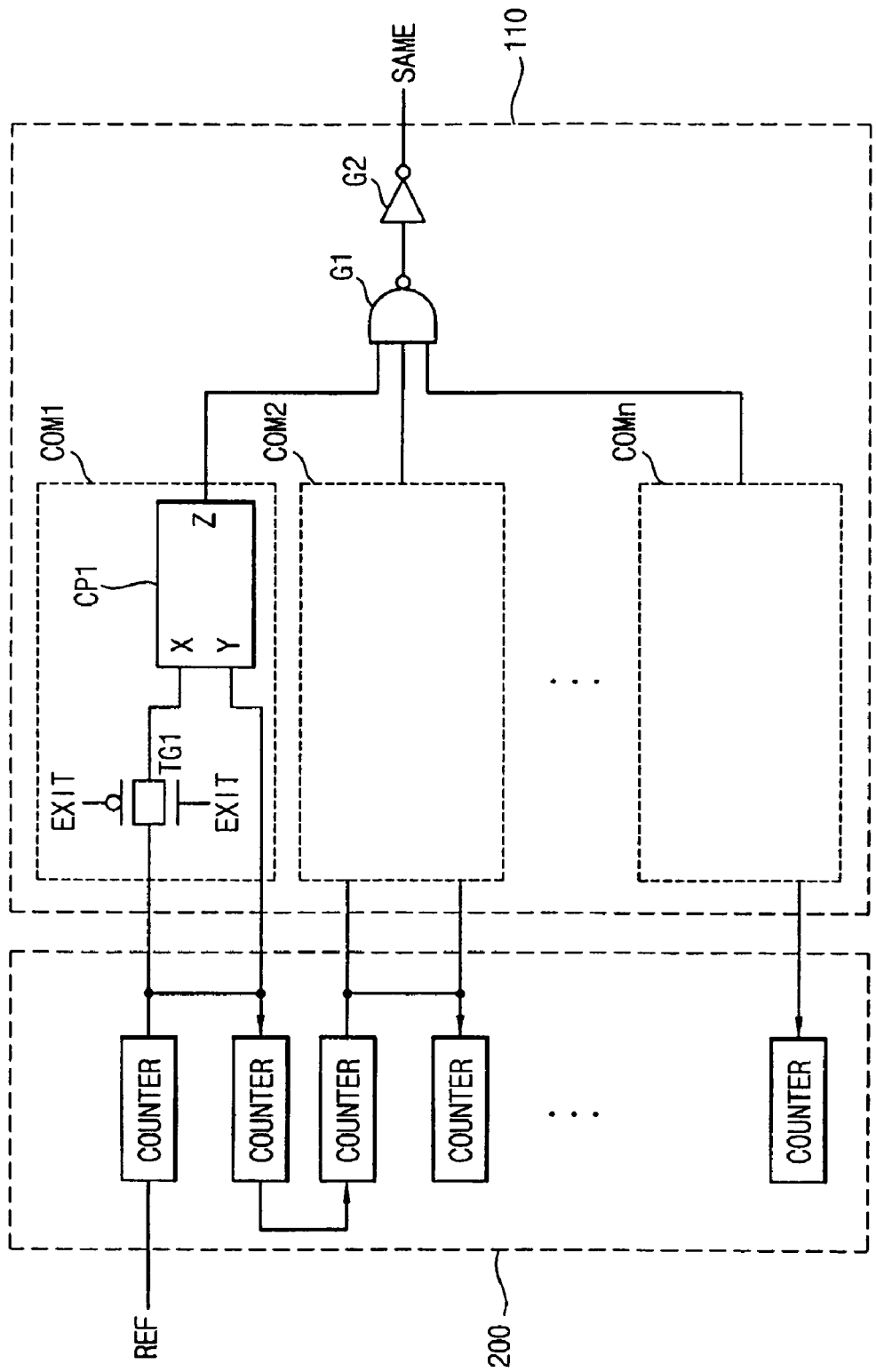
FIG. 7 is a detailed circuit diagram illustrating a twin-cell mode determining circuit in FIG. 6.
Figure 8:
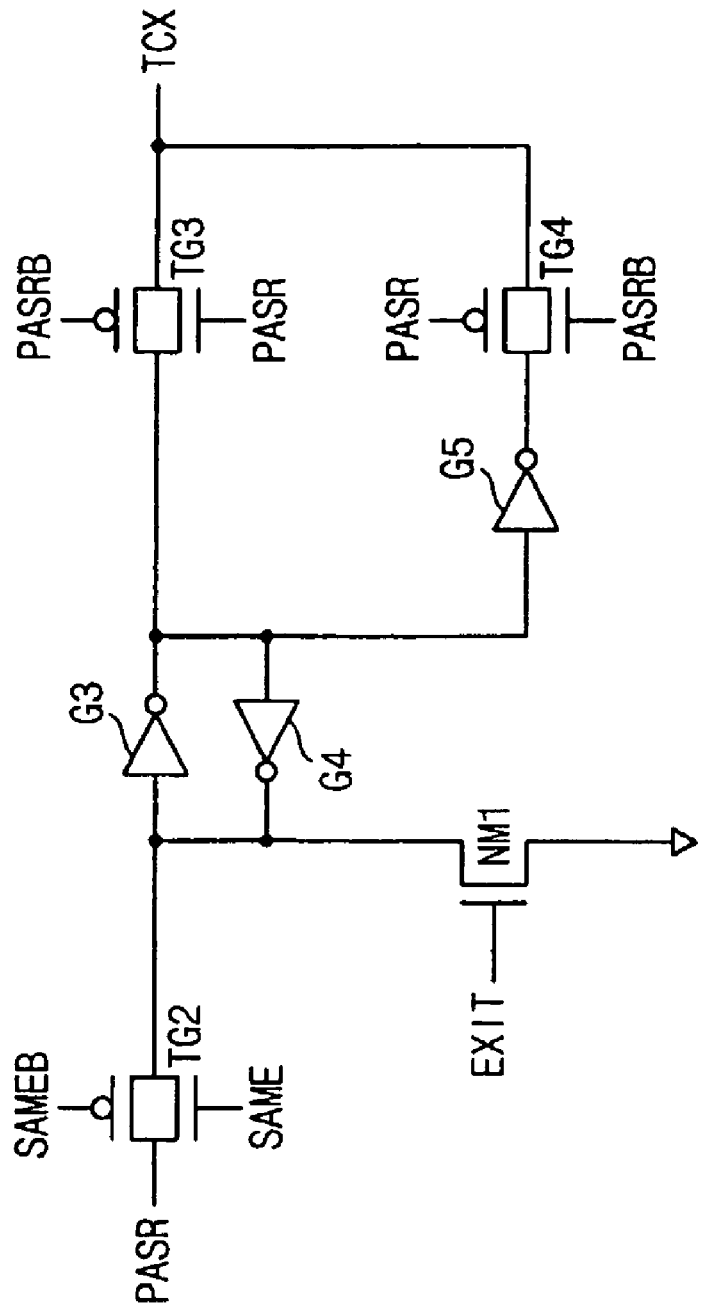
FIG. 8 is a detailed circuit diagram illustrating a control signal generator of FIG. 7.

FIG. 6 is a block diagram illustrating a twin-cell PASR control circuit according to example embodiments of the present invention. FIG. 7 is a detailed circuit diagram illustrating a twin-cell mode determining circuit in FIG. 6. FIG. 8 is a detailed circuit diagram illustrating the control signal generator of FIG. 7.

Referring to FIG. 6, a decoder 400 decodes an internal address signal DRA to generate word line driving signals DWL0 to DWLn. The internal address signal is a signal selected by a selector 300 between an external address signal EADDR and a refresh address signal RADDR. The selector 300 is switched under the control of a refresh control signal REF. A refresh counter 200 counts clock signals in response to the refresh control signal REF, to generate the refresh address signal RADDR.

A twin-cell refresh control circuit 100 includes a twin-cell mode determining circuit 110 and a control signal generator 120. The twin-cell mode determining circuit 110 receives the refresh address signal from the refresh counter 200 and compares the present refresh address signal with the previous refresh address signal stored at the completion of the PASR operations. The control signal generator 120 generates a twin-cell refresh control signal TCX in response to a comparison result from the twin-cell mode determining circuit 110.

Referring to FIG. 7, the twin-cell mode determining circuit 110 includes multiple bit comparators COM1 through COMn and output gates G1 and G2. The bit comparator COM1 includes a comparator CP1 and a transfer gate TG1 to be turned on in response to a PASR termination signal EXIT. The comparator CP1 receives, via an input terminal X, the address bit signal at the completion of the PASR operations and stores that address signal. The comparator CP1 also receives the present address bit signal via an input terminal Y, and compares the stored address bit signal with the present address bit signal. When these two address bit signals are identical to each other, the comparator CP1 outputs a comparison output Z, as a logic 'high' signal.

Therefore, when all of the address bit signals are respectively identical to each other in the respective comparators, each of the comparison outputs of the bit comparators COM1 to COMn are at a logic 'high' level. A logic gate G1 and an inverter G2 execute a logical conjunction operation of the comparison outputs to output a twin-cell mode determining signal SAME. That is, the twin-cell mode determining signal SAME is transitioned to a logic 'high' level at the last address signal of a refresh period.

Referring to FIG. 8, the control signal generator 120 includes transfer gates TG2, TG3 and TG4, an NMOS transistor NM1, and inverters G3, G4 and G5. A PASR signal is transferred to a latch, which consists of the inverters G3 and G4, via the transfer gate TG2. The transfer gate TG2 is turned on when the twin-cell mode determining signal SAME is at a logic 'high' level.

The latch, including the inverters G3 and G4, has an input terminal coupled to a ground power level via the NMOS transistor NM1. The NMOS transistor NM1 is turned on in response to the PASR termination signal EXIT. Therefore, the latch including the inverters G3 and G4 resets an output terminal to a logic 'high' level, when the PASR termination signal EXIT is applied to the NMOS transistor NM1 and the input of the latch becomes a logic 'low' level.

The output signal of the latch is output via the transfer gate TG3 as the twin-cell mode control signal TCX. The transfer gate TG3 is turned on when the PASR signal is a logic 'high' level. The output signal of the latch is also output via the inverter G5 and the transfer gate TG4. The transfer gate TG4 is turned on when the PASR signal is a logic 'low' level. Therefore, for the PASR mode of refresh operation, the twin-cell mode control signal TCX is selected as the output of the latch, and for the normal mode of refresh operation, the twin-cell mode control signal TCX is selected as the inverted output of the latch.

In the normal mode, the latch is reset, and the output signal of the latch becomes a logic 'high' level. The transfer gate TG3 is turned off, and the transfer gate TG4 is turned on. The output signal of the latch is transferred via the inverter G5 and the transfer gate TG4 so that the twin-cell mode control signal TCX is deactivated.

Upon entering the PASR mode, the PASR signal becomes a logic 'high' level so as to turn the transfer gate TG4 off and the transfer gate TG3 on. Then, the twin-cell mode control signal TCX is activated. Because the twin-cell mode determining signal SAME becomes a logic 'high' at the time of completion of the first period of the refresh operation, the transfer gate TG2 is turned on. The latch receives the PASR signal, which is a logic 'high' level, and outputs a signal at a logic 'low' level. Therefore, the twin-cell mode control signal TCX is then deactivated following completion of the first period of the refresh operation.

Figure 9:
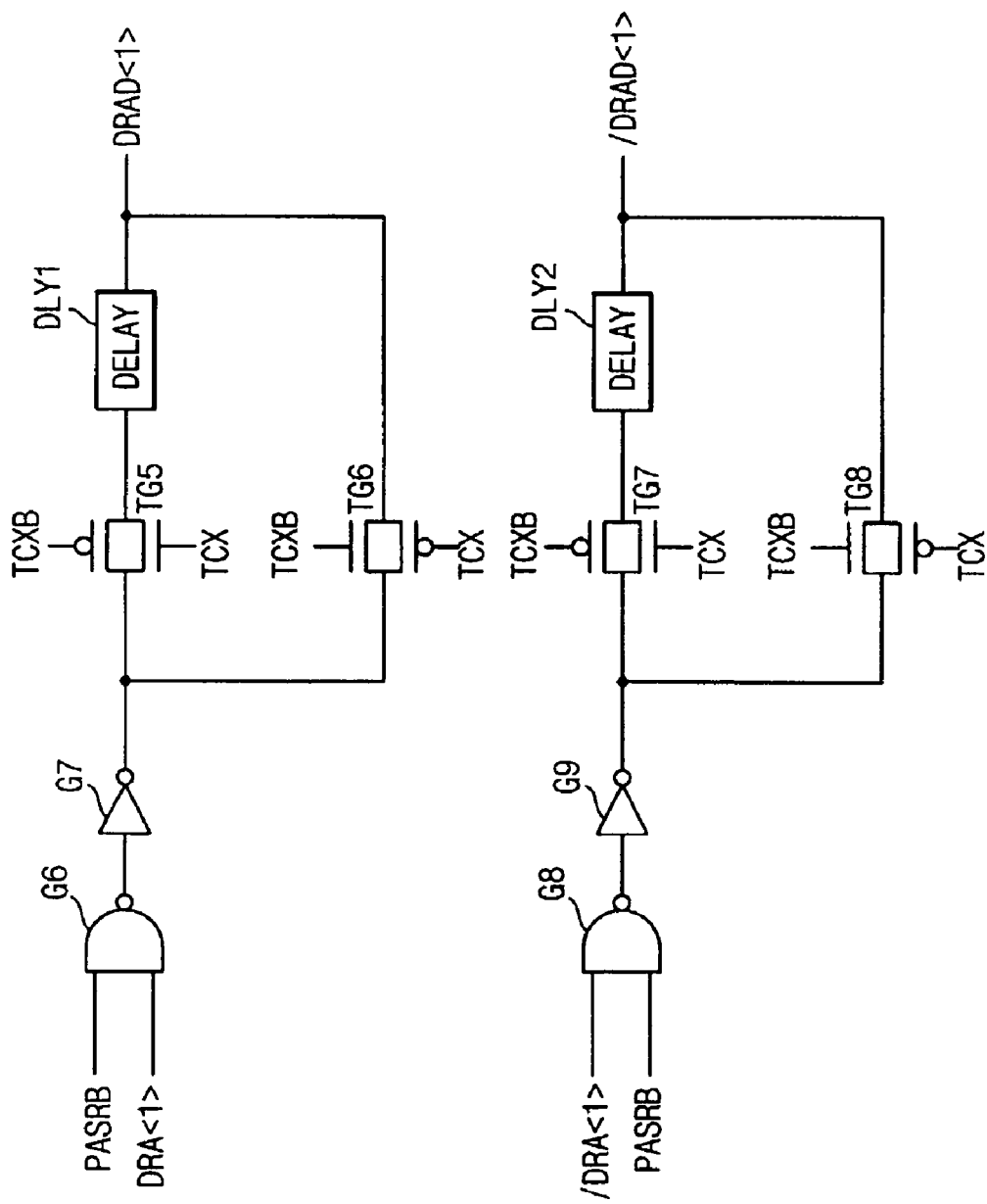
FIG. 9 is a detailed circuit diagram illustrating a decoder for a twin-cell mode refresh according to example embodiments of the present invention.

FIG. 9 is a detailed circuit diagram illustrating a decoder for a twin-cell mode refresh operation circuit according to example embodiments of the present invention.

Referring to FIG. 9, an address signal DRA<1> is blocked in response to the PASR signal when the PASR signal is at a logic 'high' level. However, the address signal DRA<1> is applied concurrently to transfer gates TG5 and TG6 via logic gates G6 and G7, when the PASR signal is at a logic 'low' level (that is, when an inverted PASR signal PASRB is at a logic 'high' level). The transfer gate TG5 is turned on when the twin-cell mode control signal TCX is at a logic 'high' level, and the transfer gate TG6 is turned on when the twin-cell mode control signal TCX is at a logic 'low' level. The address signal DRA<1> that is transferred via the transfer gate TG5, passes through a delay unit DLY1 and is output as an address signal DRAD<1>. The address signal DRA<1> that is transferred via the transfer gate TG6, does not pass through a delay and is output as an address signal DRAD<1>.

When the PASR signal is at a logic 'high' level, an address signal /DRA<1> is blocked in response to the PASR signal. However, the address signal /DRA<1> is applied concurrently to transfer gates TG7 and TG8 via logic gates G8 and G9, when the PASR signal is at a logic 'low' level (that is, when an inverted PASR signal PASRB is at a logic 'high' level). The transfer gate TG7 is turned on when the twin-cell mode control signal TCX is at a logic 'high' level, and the transfer gate TG8 is turned on when the twin-cell mode control signal TCX is at a logic 'low' level. The address signal /DRA<1> that is transferred via the transfer gate TG7 passes through a delay unit DLY2 and is output as an address signal /DRAD<1>. The address signal /DRA<1> that is also transferred via the transfer gate TG8, does not pass through a delay unit and is output as an address signal /DRAD<1>.

As described above, the DRAM device according to the example embodiments of the present invention can extend the period required for refresh operations by applying a PASR technique that is normally applied to a twin-cell DRAM to a single-cell DRAM. The DRAM device according to the example embodiments of the present invention can also execute the refresh operations at a high speed.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A dynamic random-access memory (DRAM) device comprising:
   a memory cell array including a plurality of memory cells, the memory cells being respectively allocated in sections defined by a plurality of word lines a plurality of bit line pairs; and
   a decoder that is configured to:
      select a single cell of the word line and the bit line to write one bit of data in the single cell, the single cell being designated by an external address signal;
      sequentially select each word line of a word line pair corresponding to a twin cell including the single cell so that inverted data of the data written in the single cell is to be written in the other single cell of the twin cell, during a first refresh period of a partial array self-refresh (PASR) mode; and
      concurrently select the word lines of the word line pair corresponding to the twin cell to execute twin-cell self-refresh operations, during subsequent refresh periods of the PASM mode following the first refresh period.

2. The DRAM device of claim 1, wherein, during the first refresh period, the decoder first activates the word line corresponding to the single cell of the twin cell, then activates the other word line corresponding to the other single cell of the twin cell, and then concurrently deactivates the activated word lines corresponding to the single cell and the other single cell of the twin cell.

3. The DRAM device of claim 2, wherein the first refresh period is a period of a single-cell refresh mode, and the subsequent refresh period is a period of a twin-cell refresh mode.

4. The DRAM device of claim 3, wherein the period of the twin-cell refresh mode is on the basis of a period for refreshing a memory cell containing data '0'.

5. The DRAM device of claim 1, further comprising:
   a twin-cell refresh control circuit configured to compare a present internal refresh address signal with a termination internal address signal corresponding to an address at termination of the PASR mode to generate a twin-cell refresh control signal based on the comparison result, and configured to provide the twin-cell refresh control signal to the decoder.

6. The DRAM device of claim 5, wherein the twin-cell refresh control circuit comprises:
   a twin-cell mode determining circuit configured to compare the present internal refresh address signal with the termination internal address signal corresponding to the address at termination of the PASR mode; and
   a control signal generator configured to generate the twin-cell refresh control signal based on the comparison result.

7. A method of a partial array self-refresh (PASR) operation for a dynamic random access memory device, comprising:
   initiating a PASR mode;
   writing data into a first single cell of a twin cell and inverted data of the data into a second single cell of the twin cell, during a first refresh period of the PASR mode; and
   concurrently refreshing the first and second single cells that are included in the twin cell, during subsequent refresh periods of the PASR mode following the first refresh period.

8. The method of claim 7, wherein the first refresh period is a period of a single-cell refresh mode, and the subsequent refresh period is a period of a twin-cell refresh mode.

9. The method of claim 8, wherein the period of the twin-cell refresh mode is on the basis of a period for refreshing a memory cell containing data '0'.

10. The method of claim 7, wherein one of the single cells that are included in the twin cell is used for storing data in the PASR mode.

* * * * *